(12) United States Patent
Testin

(10) Patent No.: US 7,495,400 B2
(45) Date of Patent: Feb. 24, 2009

(54) APPARATUS AND METHOD FOR CONTROLLING TEMPERATURE

(75) Inventor: William John Testin, Indianapolis, IN (US)

(73) Assignee: Thomson Licensing, Boulogne-Billancourt (FR)

(*) Notice: Subject to any disclaimer, the term of this patent is extended or adjusted under 35 U.S.C. 154(b) by 243 days.

(21) Appl. No.: 10/584,368

(22) PCT Filed: Dec. 10, 2004

(86) PCT No.: PCT/US2004/041239

§ 371 (c)(1),
(2), (4) Date: Jun. 22, 2006

(87) PCT Pub. No.: WO2005/066732

PCT Pub. Date: Jul. 21, 2005

(65) Prior Publication Data

US 2007/0182608 A1     Aug. 9, 2007

Related U.S. Application Data

(60) Provisional application No. 60/533,140, filed on Dec. 30, 2003.

(51) Int. Cl.
*H02P 1/00* (2006.01)
(52) U.S. Cl. .................. 318/268; 318/471; 318/783
(58) Field of Classification Search .................. 318/268, 318/254, 138, 439, 471, 783
See application file for complete search history.

(56) References Cited

U.S. PATENT DOCUMENTS

| 5,825,642 A | 10/1998 | Tshii et al. |
| 5,957,663 A * | 9/1999 | Van Houten et al. .......... 417/13 |
| 5,971,284 A | 10/1999 | Hammer |
| 6,182,902 B1 | 2/2001 | Shih |
| 2002/0140389 A1 | 10/2002 | Ohki et al. |
| 2005/0104460 A1* | 5/2005 | Kusase et al. .................. 310/63 |

FOREIGN PATENT DOCUMENTS

JP     2003-319677     7/2003

* cited by examiner

*Primary Examiner*—Karen Masih
(74) *Attorney, Agent, or Firm*—Robert D. Shedd; Joseph J. Opalach; Reitseng Lin

(57) ABSTRACT

A temperature control apparatus is suitable for use in devices such as consumer electronics devices having different thermal characteristics. According to an exemplary embodiment, the temperature control apparatus includes a fan having a field winding (F3) and a speed controller for providing a speed control signal to the field winding (F3) responsive to a first control signal to control a rotating speed of the fan. First and second terminals of the fan enable operating power to be provided to the field winding (F3) and the speed controller. At least one of the first and second terminals is operatively coupled to a first voltage source. A third terminal of the fan provides the first control signal to the speed controller, and is operatively coupled to a second voltage source. The temperature control apparatus further includes a temperature measuring circuit operative to measure a temperature and provide a temperature indicating signal indicating the measured temperature, a processor operative to provide a second control signal responsive to the temperature indicating signal, and control circuitry operative to provide the first control signal to the third terminal of the fan responsive to the second control signal.

12 Claims, 5 Drawing Sheets

APPARATUS AND METHOD FOR CONTROLLING TEMPERATURE

CROSS REFERENCE TO RELATED APPLICATION

This application claims the benefit, under 35 U.S.C. §365 of International Application PCT/US2004/041239, filed Dec. 10, 2004, which was published in accordance with PCT Article 21(2) on Jul. 21, 2005 in English, and claims priority of 60/533,140 filed Dec. 30, 2003.

This application claims priority to and all benefits accruing from a Provisional application filed in the United States Patent and Trademark Office on Dec. 30, 2003, and there assigned Ser. No. 60/533,140.

BACKGROUND OF THE INVENTION

1. Field of the Invention

The present invention generally relates to temperature control, and more particularly, to a cost-effective temperature control apparatus including a variable-speed fan that is suitable for use in devices such as consumer electronics devices having different thermal characteristics, and a method for controlling temperature using such a device.

2. Background Information

Devices such as consumer electronic devices often require a temperature control mechanism such as a fan to prevent damage from excessive heat. At present, there are various different types of fans that may be used by such devices for temperature control. One such type of fan may be controlled by a thermistor. Thermistor-controlled fans can be a cost-effective option for temperature control in certain applications, but are disadvantageous in that the relationship between fan speed and temperature is fixed by the thermistor. Accordingly, thermistor-controlled fans may be unsuitable for certain applications. For example, thermistor-controlled fans may be unsuitable for applications in which the fan's orientation in a final device may vary (e.g., from model to model), and thereby require the relationship between fan speed and temperature to be modified in order to compensate for different thermal characteristics.

Another type of fan can be controlled by pulse width modulation (PWM). In short, PWM-controlled fans use the relative width of pulses in a train of on and off pulses to control the amount of power applied to the fan motor, and thereby control its rotating speed. Currently available PWM-controlled fans tend to be relatively expensive since they may utilize an expensive high-current transistor driven by the fan's operating power for receiving the pulses that control the fan's rotating speed. As a result, currently-available PWM-controlled fans may be unduly expensive for certain applications, particularly those applications where cost is a critical consideration.

Accordingly, there is a need for a cost-effective temperature control apparatus including a variable-speed fan that avoids the foregoing deficiencies, and is suitable for use in devices such as consumer electronics devices having different thermal characteristics. The present invention addresses these and/or other issues.

SUMMARY OF THE INVENTION

In accordance with an aspect of the present invention, a temperature control apparatus is disclosed. According to an exemplary embodiment, the temperature control apparatus comprises a fan including a field winding, and a speed controller for providing a speed control signal to the field winding responsive to a first control signal to control a rotating speed of the fan. First and second terminals of the fan enable operating power to be provided to the field winding and the speed controller. At least one of the first and second terminals is operatively coupled to a first voltage source. A third terminal of the fan provides the first control signal to the speed controller. The third terminal is operatively coupled to a second voltage source. The temperature control apparatus further comprises temperature measurement means for measuring a temperature and providing a temperature indicating signal indicating the measured temperature, processing means for providing a second control signal responsive to the temperature indicating signal, and control means for providing the first control signal to the third terminal of the fan responsive to the second control signal.

In accordance with another aspect of the present invention, a method for controlling temperature is disclosed. According to an exemplary embodiment, the method comprises steps of providing a fan having a field winding, a speed controller for providing a speed control signal to the field winding responsive to a first control signal to control a rotating speed of the fan, first and second terminals for enabling operating power to be provided to the field winding and the speed controller, and a third terminal for providing the first control signal to the speed controller. At least one of the first and second terminals is operatively coupled to a first voltage source, and the third terminal is operatively coupled to a second voltage source. The method further comprises steps of measuring a temperature and providing a temperature indicating signal indicating the measured temperature, providing a second control signal responsive to the temperature indicating signal, and providing the first control signal to the third terminal of the fan responsive to the second control signal.

In accordance with yet another aspect of the present invention, a device having a temperature control apparatus is disclosed. According to an exemplary embodiment, the temperature control apparatus comprises a fan including a field winding, and a speed controller for providing a speed control signal to the field winding responsive to a first control signal to control a rotating speed of the fan. First and second terminals of the fan enable operating power to be provided to the field winding and the speed controller. At least one of the first and second terminals is operatively coupled to a first voltage source. A third terminal of the fan provides the first control signal to the speed controller. The third terminal is operatively coupled to a second voltage source. The temperature control apparatus further comprises a temperature measuring circuit operative to measure a temperature and provide a temperature indicating signal indicating the measured temperature, a processor operative to provide a second control signal responsive to the temperature indicating signal, and control circuitry operative to provide the first control signal to the third terminal of the fan responsive to the second control signal.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Throughout the drawings, like reference numbers represent the same or similar elements. The exemplifications set out herein illustrate preferred embodiments of the present invention, and such exemplifications are not to be construed as limiting the scope of the present invention in any manner.

DESCRIPTION OF THE PREFERRED EMBODIMENTS

Figure 1:
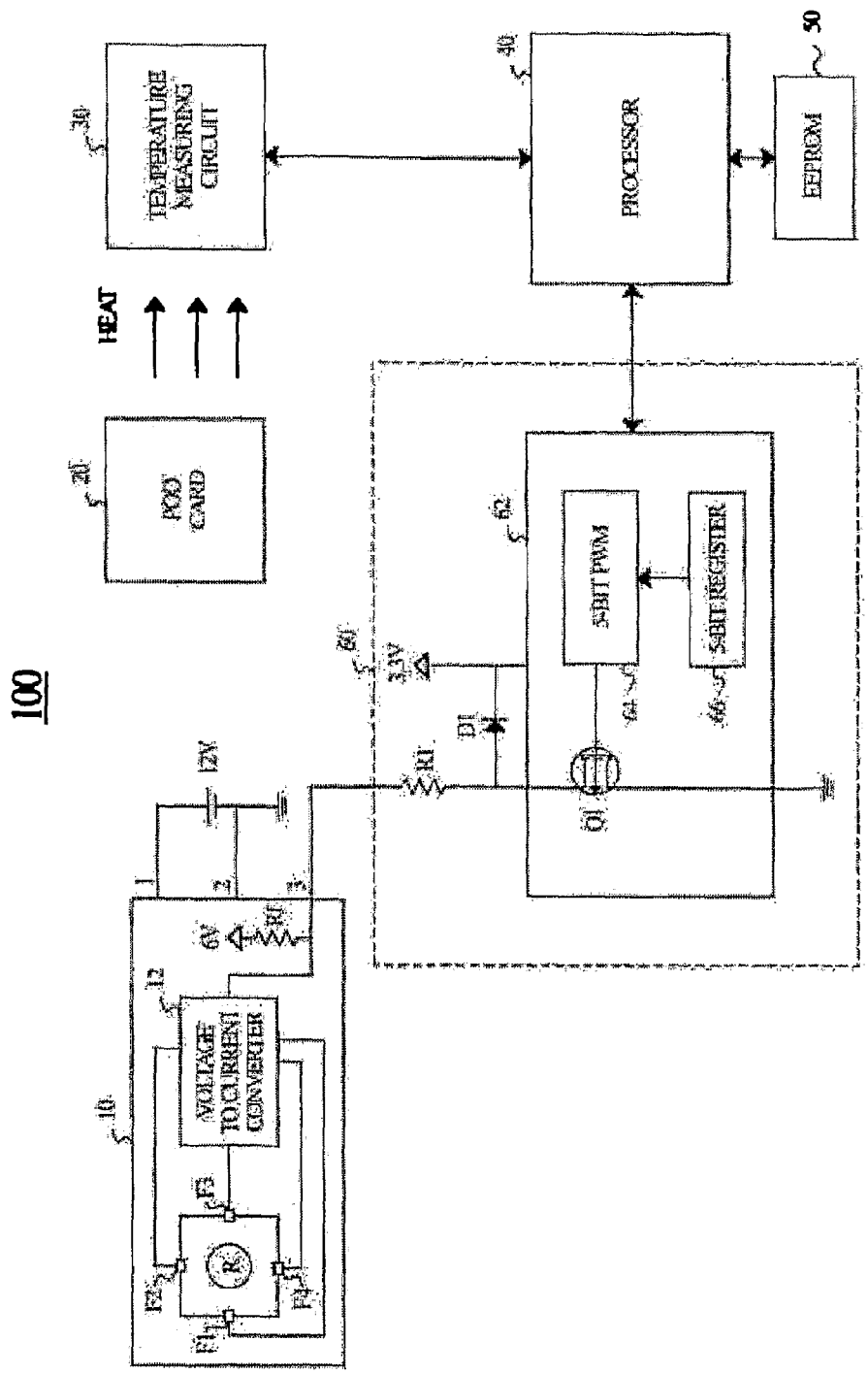
FIG. 1 is a diagram of a temperature control apparatus according to an exemplary embodiment of the present invention.

Referring now to the drawings, and more particularly to FIG. 1, a diagram of a temperature control apparatus 100 according to an exemplary embodiment of the present invention is shown. As shown in FIG. 1, temperature control apparatus 100 comprises a fan 10, a point of distribution (POD) card 20, temperature measuring means such as temperature measuring circuit 30, processing means such as processor 40, memory means such as electrically-erasable programmable read-only memory (EEPROM) 50, and control means such as control circuitry 60. Some of the foregoing elements of temperature control apparatus 100 may be embodied using integrated circuits (ICs), and some elements may for example be included on one or more ICs. For clarity of description, certain conventional elements associated with temperature control apparatus 100 such as certain control signals, power signals and/or other elements may not be shown in FIG. 1. According to an exemplary embodiment, temperature control apparatus 100 may be included in a device such as a consumer electronic device for performing a temperature control function.

Fan 10 is operative to enable the aforementioned temperature control function. According to an exemplary embodiment, fan 10 comprises a rotor R, field windings F1 to F4, a voltage to current converter 12, a resistor Rf, and three input terminals 1 to 3. Rotor R is rotated in response to an electrical field applied through field windings F1 to F4 which opposes a fixed magnet in rotor R. Voltage to current converter 12 controls the rotating speed of fan 10 based on a first control signal received via terminal 3 of fan 10. As shown in FIG. 1, voltage to current converter 12 provides a speed control signal to field winding F3 responsive to the first control signal received via terminal 3 to thereby control the rotating speed of fan 10. Resistor Rf is operatively coupled between terminal 3 of fan 10 and a voltage source of 6V. According to an exemplary embodiment, resistor Rf has a value of 5 KΩ, although other values may be used.

Terminals 1 and 2 enable operating power to be provided to elements of fan 10 including field windings F1 to F4 and voltage to current converter 12. As shown in FIG. 1, terminals 1 and 2 provide the operating power to fan 10 from a voltage source of 12V, which is the main power supply of fan 10. According to the present invention, at least one of terminals 1 and 2 of fan 10 is operatively coupled to the 12V voltage source. As previously indicated herein, terminal 3 of fan 10 provides the first control signal to voltage to current converter 12 to thereby control the rotating speed of fan 10, and is operatively coupled to the aforementioned 6V voltage source. According to an exemplary embodiment, fan 10 may be embodied using a Delta model AFB0812L-SX00 fan or an equivalent thereof.

POD card 20 is operative to generate and distribute heat. According to an exemplary embodiment, POD card is embodied using a "smart-card" or similar element. Temperature measuring circuit 30 is operative to measure an ambient temperature around POD card 20. As will be described later herein, a temperature indicating signal indicating the temperature measured by temperature measuring circuit 30 is periodically read by processor 40. According to an exemplary embodiment, temperature measuring circuit 30 may be embodied using a National Semiconductor model LM77 IC or an equivalent thereof.

Processor 40 is operative to perform various processing functions. According to an exemplary embodiment, processor 40 is operative to read the temperature indicating signal indicating the temperature measured by temperature measuring circuit 30 on a periodic basis, such as once every minute or other predetermined time period. Also according to an exemplary embodiment, processor 40 is operatively coupled to temperature measuring circuit 30 via an inter-integrated circuit (IIC) bus, which is generally known in the art.

Processor 40 compares the temperature indicated by the temperature indicating signal to a predetermined threshold temperature. If the measured temperature is greater than the predetermined threshold temperature, processor 40 provides a second control signal to control circuitry 60 using digital data (e.g., temperature versus voltage table) stored in EEPROM 60. According to an exemplary embodiment, the second control signal indicates an address corresponding to a particular PWM duty cycle for the first control signal to be provided to terminal 3 of fan 10. In other embodiments of the present invention that will be described later herein, processor 40 may also provide a third control signal that is used to turn fan 10 on and off.

EEPROM 50 is operative to store digital data including the digital data that is retrieved by processor 40 to enable the temperature control function of the present invention. According to an exemplary embodiment, EEPROM 50 is operatively coupled to processor 40 via an IIC bus.

Control circuitry 60 is operative to provide the first control signal to terminal 3 of fan 10 responsive to the second control signal provided from processor 40. As shown in FIG. 1, control circuitry 60 comprises a field programmable gate array (FPGA) 62, a diode D1, and a resistor R1. FPGA 62 comprises a 5-bit PWM unit 64, a 5-bit register 66, and a transistor Q1.

According to an exemplary embodiment, the second control signal provided from processor 40 indicates an address of 5-bit register 66 that contains data indicating a particular PWM duty cycle for the first control signal to be provided to terminal 3 of fan 10. In response to the second control signal, 5-bit register 66 provides the data indicating the particular PWM duty cycle for the first control signal to 5-bit PWM unit 64 which in turn outputs pulses in accordance with the particular PWM duty cycle. According to an exemplary embodiment, the pulses output from 5-bit PWM unit 64 range from 0 to 3.3V and control the duty cycle that transistor Q1 is turned on. Transistor Q1 may be embodied as an open-drain, N-channel metal oxide semiconductor field effect transistor (MOSFET), or other type of switching means. When transistor Q1 is turned on, drain to source current flows through transistor Q1 and resistor R1 is connected to ground. According to an exemplary embodiment, resistor R1 has a value of 10 KΩ, although other values may be used.

By controlling the time that resistor R1 is grounded, the average current of the first control signal on terminal 3 of fan 10 can be varied. To control the rotating speed of fan 10, 5-bit PWM unit 64 may be run from a maximum duty cycle of 31 out of 32 steps (i.e., 5-bits) at the gate of transistor Q1 to roughly 16 out of 32 steps (i.e., 50% duty cycle). Since the maximum duty cycle results in transistor Q1 being turned on almost 100% of the time, resistor R1 appears to be grounded almost continuously in this state. In this manner, varying the duty cycle of 5-bit PWM unit 64 from 50% to 100% varies the rotating speed of fan 10 from minimum to maximum speed. The use of 5-bit data for controlling duty cycle is exemplary only, and other numbers of bits may also be used.

According to an exemplary embodiment, the minimum PWM value may need to be controlled to prevent the peak voltage on the drain of transistor Q1 from exceeding the 3.9V rating on FPGA 62. With fan 10, terminal 3 floats to 6V when open-circuited. To prevent an over-voltage problem, Schottky diode D1 is connected from the drain of transistor Q1 to the 3.3V supply of FPGA 62. In this manner, diode D1 limits the peak voltage on the drain of transistor Q1 to 0.4V above the 3.3V supply of FPGA 62.

Figure 2:
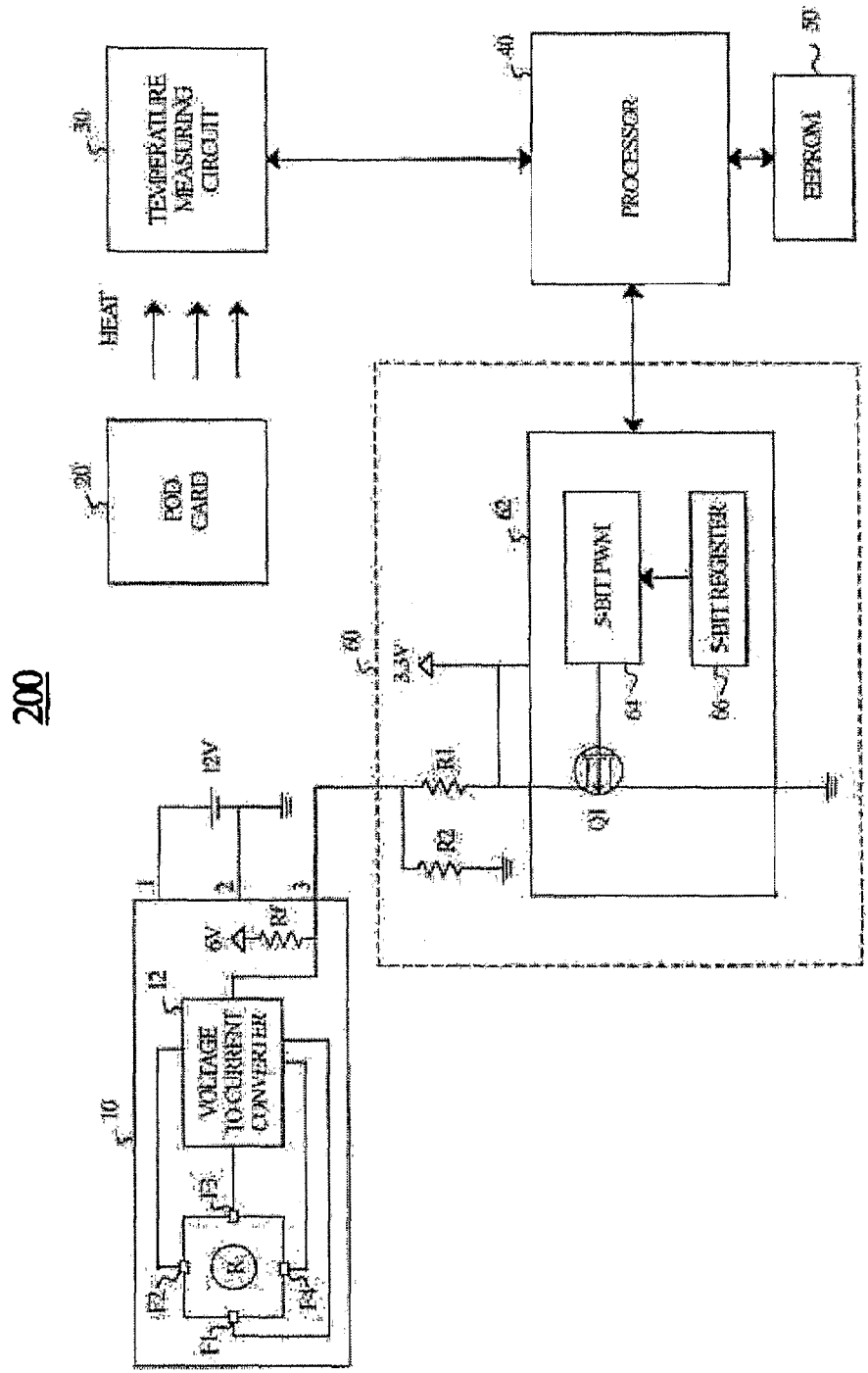
FIG. 2 is a diagram of a temperature control apparatus according to another exemplary embodiment of the present invention.

Referring to FIG. 2, a diagram of a temperature control apparatus 200 according to another exemplary embodiment of the present invention is shown. Temperature control apparatus 200 of FIG. 2 is substantially identical to temperature control apparatus 100 of FIG. 1, except that temperature control apparatus 200 of FIG. 2 further includes resistor R2 and eliminates diode D1. Resistor R2 allows a minimum current to be set up which limits the maximum voltage seen by the drain of transistor Q1. Resistor R1 then just controls the additional current needed to run fan 10 from minimum to maximum speed. According to an exemplary embodiment, resistors R1 and R2 are both 5.1 KΩ, although other values may be used. With temperature control apparatus 200 of FIG. 2, the voltage present on terminal 3 of fan 10 ranges from 2.9V to 1.9V. Voltage to current converter 12 of fan 10 uses this voltage variation to vary the rotating speed of fan 10 from a minimum speed of 800 RPM to a maximum speed of 2000 RPM. In addition to eliminating the potential voltage problem on the drain of transistor Q1, temperature control apparatus 200 of FIG. 2 also eliminates the need to limit the PWM range since the full range is useable. That is, resistors R1 and R2 enable the current in terminal 3 of fan 10 to be linearly controlled from a 0% duty cycle to a 100% duty cycle. To minimize noise with temperature control apparatuses 100 and 200 of FIGS. 1 and 2, respectively, it may be desirable to keep the PWM period above 20 kHz.

Figure 3:
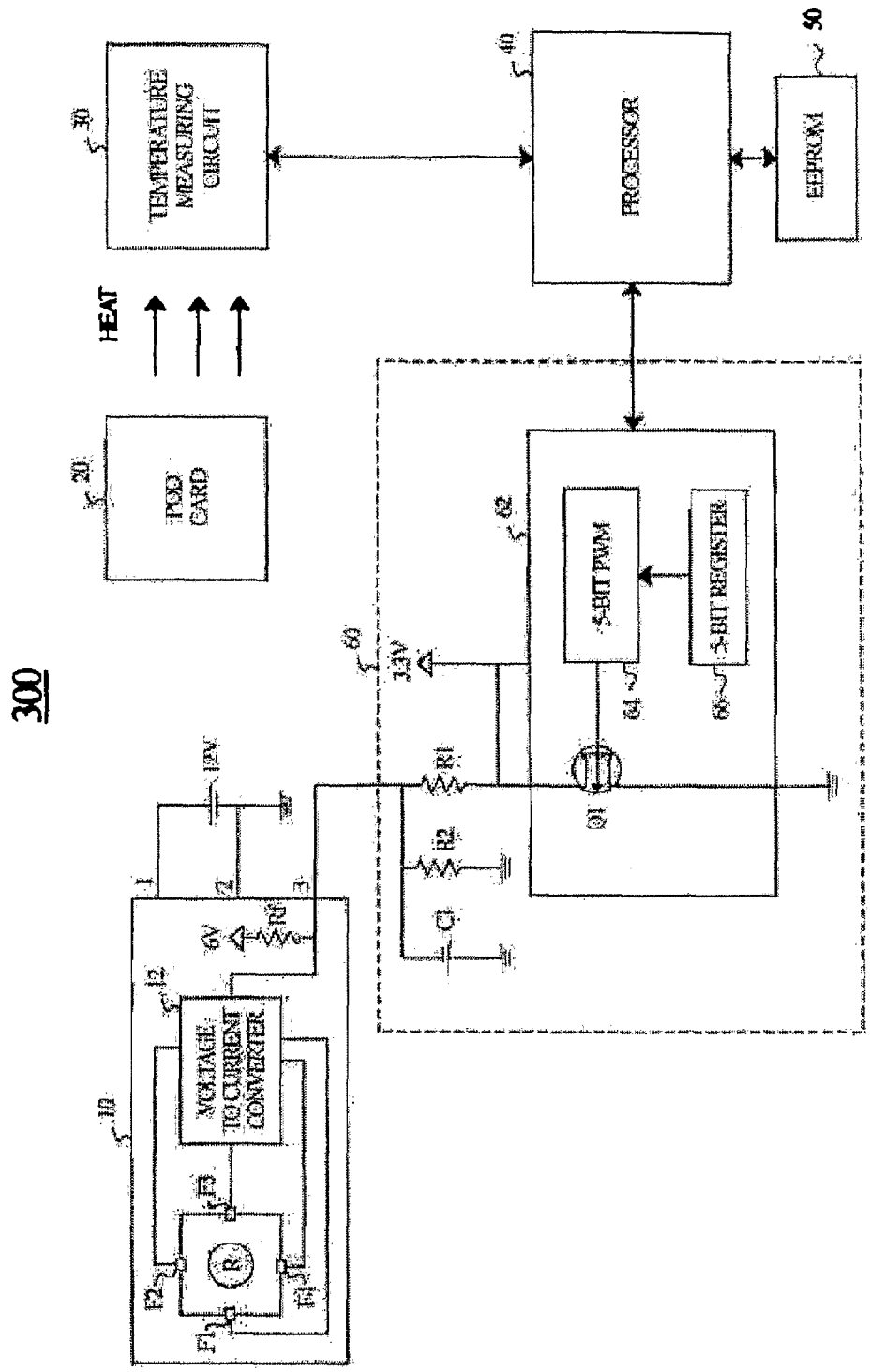
FIG. 3 is a diagram of a temperature control apparatus according to yet another exemplary embodiment of the present invention.

Referring to FIG. 3, a diagram of a temperature control apparatus 300 according to yet another exemplary embodiment of the present invention is shown. Temperature control apparatus 300 of FIG. 3 is substantially identical to temperature control apparatus 200 of FIG. 2, except that temperature control apparatus 300 of FIG. 3 further includes a capacitor C1 in parallel with resistor R2. According to an exemplary embodiment, capacitor C1 is operative to integrate the average current through resistor R1 in parallel with resistor R2 to thereby eliminate a time-varying signal input to terminal 3 of fan 10. One primary advantage to the addition of capacitor C1 is the elimination of any frequency dependence on 5-bit PWM unit 64. In particular, 5-bit PWM unit 64 may operate at a frequency as low as a few kilohertz without creating any audible noise. Also according to an exemplary embodiment, capacitor C1 has a value of 10 µF, although other values may be used.

Figure 4:
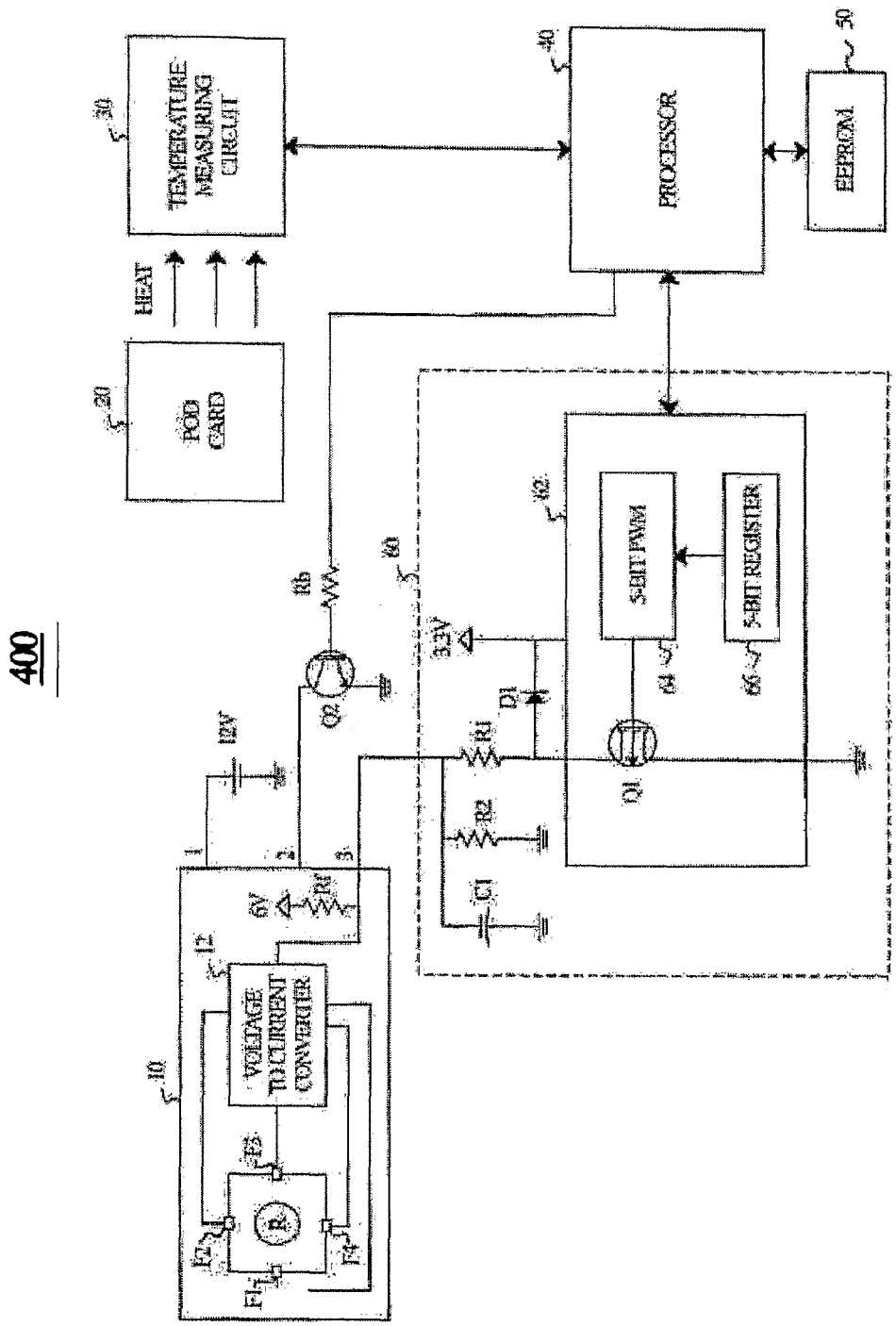
FIG. 4 is a diagram of a temperature control apparatus according to still yet another exemplary embodiment of the present invention.

Referring to FIG. 4, a diagram of a temperature control apparatus 400 according to still yet another exemplary embodiment of the present invention is shown. Temperature control apparatus 400 of FIG. 4 is substantially identical to temperature control apparatus 300 of FIG. 3, except that temperature control apparatus 400 of FIG. 4 further includes a transistor Q2, a resistor Rb, and diode D1. According to an exemplary embodiment, transistor Q2 is embodied as an NPN-type transistor, but may be embodied as any type of switching mechanism. The addition of transistor Q2 in FIG. 4 enables fan 10 to be selectively turned on and off responsive to a control signal from processor 40 that is applied to the base terminal of transistor Q2. As indicated in FIG. 4, the collector of transistor Q2 is operatively coupled to terminal 3 of fan 10, and the emitter thereof is operatively coupled to ground. According to an exemplary embodiment, resistor Rb has a value of 10 KΩ, although other values may be used.

Figure 5:
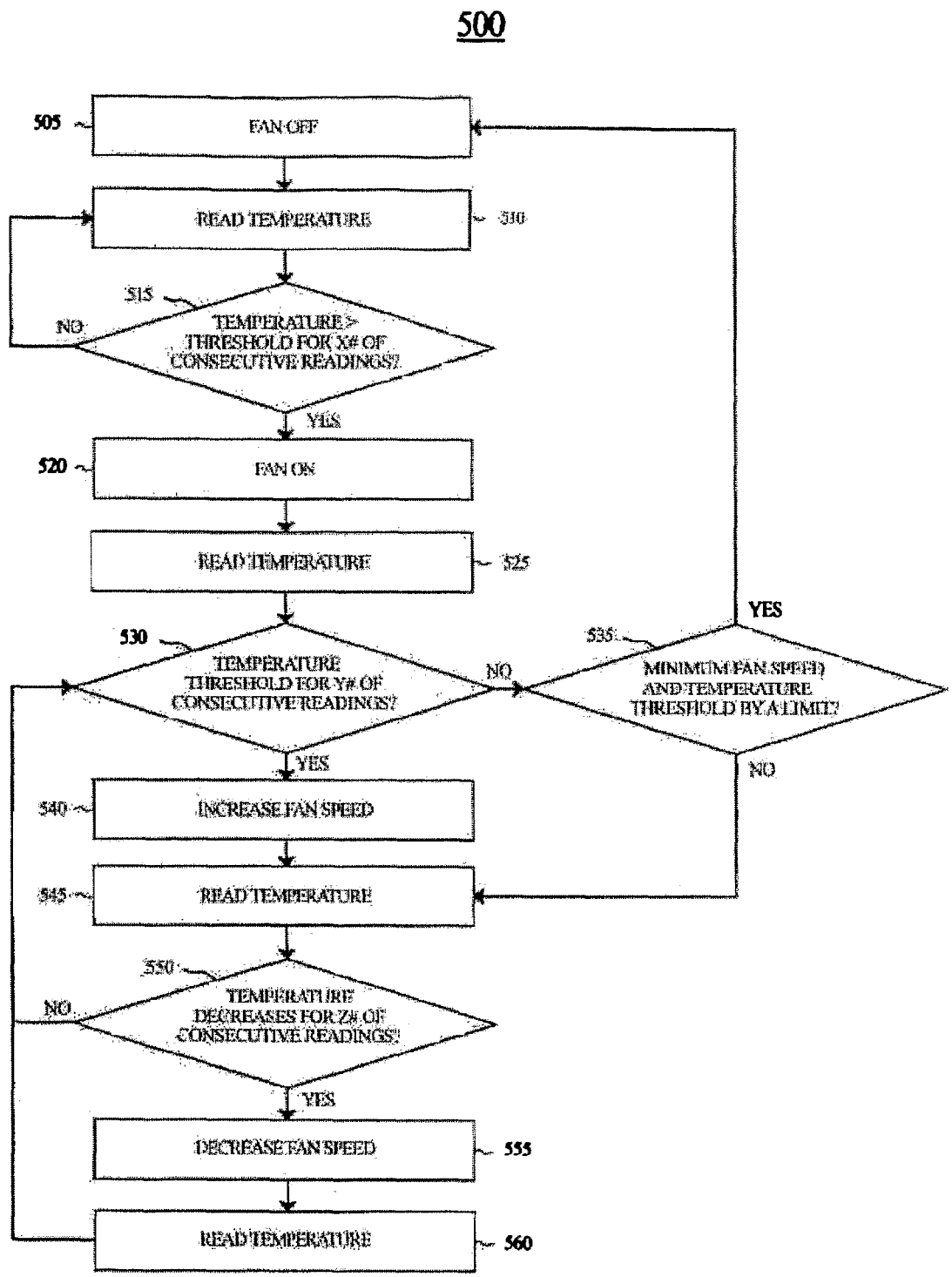
FIG. 5 is a flowchart illustrating steps for controlling temperature according to an exemplary embodiment of the present invention.

To facilitate a better understanding of the present invention, an example will now be provided. Referring to FIG. 5, a flowchart 500 illustrating steps for controlling temperature according to an exemplary embodiment of the present invention is shown. For purposes of example and explanation, the steps of FIG. 5 will be described with reference to temperature control apparatus 400 of FIG. 4. The steps of FIG. 5 are exemplary only, and are not intended to limit the present invention in any manner.

At step 505, fan 10 is turned off. According to an exemplary embodiment, processor 40 provides a logic low signal to the base of transistor Q2 and thereby causes fan 10 to be turned off at step 505. At step 510, a temperature reading is performed. According to an exemplary embodiment, processor 40 initiates the temperature reading at step 510 by providing a control signal to temperature measuring circuit 30 via the IIC bus that connects processor 40 and temperature measuring circuit 30. In response to the control signal, temperature measuring circuit 30 provides a temperature indicating signal indicating the measured ambient temperature around POD card 20 to processor 40 via the IIC bus. According to an exemplary embodiment, processor 40 reads the temperature indicating signal from temperature measuring circuit 30 on a periodic basis, such as once every minute or other predetermined time period.

At step 515, a determination is made as to whether the temperature read at step 510 is greater than a predetermined threshold temperature for X number of consecutive readings. According to an exemplary embodiment, processor 40 is programmed to make the determination at step 515, and X is equal to 5 although other values may also be used. If the determination at step 515 is negative, process flow loops back to step 510 where processor 40 performs another temperature reading in accordance with the predetermined time period (e.g., once every minute). Alternatively, if the determination at step 515 is positive, process flow advances to step 520 where fan 10 is tuned on to its minimum speed. According to an exemplary embodiment, processor 40 provides a logic high signal to the base of transistor Q2 and thereby causes fan 10 to be turned on at step 520. Processor 40 also provides the second control signal to FPGA 62 which enables generation of the first control signal on terminal 3 of fan 10 at a duty cycle corresponding to minimum fan speed.

At step 525, another temperature reading is performed in the manner previously described above at step 510. At step 530, a determination is made as to whether the read temperature is greater than the predetermined threshold temperature for Y number of consecutive readings. According to an exemplary embodiment, processor 40 is programmed to make the determination at step 530, and Y is equal to 2 although other values may also be used. If the determination at step 530 is negative, process flow advances to step 535 where a determination is made as to whether fan 10 is running at its minimum speed and the read temperature is less than the threshold temperature by a predetermined temperature limit. According to an exemplary embodiment, processor 40 is programmed to make the determination at step 535 and the predetermined temperature limit used at step 535 is a matter of design choice.

If the determination at step 535 is positive, process flow loops back to step 505 where fan 10 is tuned off by processor 40 providing a logic low signal to the base of transistor Q2. Alternatively, if the determination at step 535 is negative, process flow advances to step 545 where another temperature reading is performed in the manner previously described above at step 510. If the determination at step 530 is positive, process flow advances to step 540 where the speed of fan 10 is increased by one step. According to an exemplary embodiment, processor 40 provides the second control signal to FPGA 62 which in turn increases the duty cycle of the first control signal on terminal 3 of fan 10 by one step, and thereby increases the speed of fan 10 by one step at step 540. From step 540, process flow advances to step 545 where another temperature reading is performed in the manner previously described above at step 510.

At step 550, a determination is made as to whether the temperature read at step 545 has decreased for Z number of consecutive readings. According to an exemplary embodiment, processor 40 is programmed to make the determination at step 550, and Z is equal to 4 although other values may also be used. If the determination at step 550 is negative, process flow loops back to step 530 previously described herein. Alternatively, if the determination at step 550 is positive, process flow advances to step 555 where the speed of fan 10 is decreased by one step. According to an exemplary embodiment, processor 40 provides the second control signal to FPGA 62 which in turn decreases the duty cycle of the first control signal on terminal 3 of fan 10 by one step, and thereby decreases the speed of fan 10 by one step at step 555. From step 555, process flow advances to step 560 where another temperature reading is performed in the manner previously described above at step 510. From step 560, process flow loops back to step 530 previously described herein. The steps of FIG. 5 may be repeated in the indicated manner. The steps of FIG. 5 may be used to maintain temperature below a given threshold (e.g., less than 65° C., etc.).

As described herein, the present invention provides a cost-effective temperature control apparatus including a variable-speed fan that is suitable for use in devices such as consumer electronics devices having different thermal characteristics, and a method for controlling temperature using such a device. The present invention may be applicable to various devices, either with or without an integrated display element. Accordingly, the phrase "consumer electronics device" as used herein may refer to systems or devices including, but not limited to, television sets, computers or monitors that include an integrated display element, and systems or devices such as set-top boxes, video cassette recorders (VCRs), digital versatile disk (DVD) players, video game boxes, personal video recorders (PVRs), computers or other devices that may not include an integrated display element.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A temperature control apparatus, comprising:
a fan, including:
   a field winding;
   a speed controller for providing a speed control signal to said field winding responsive to a first control signal to control a rotating speed of said fan;
   first and second inputs for enabling operating power to be provided to said field winding and said speed controller, at least one of said first and second inputs being operatively coupled to a first voltage source; and
   a third input for providing said first control signal to said speed controller, said third input being operatively coupled to a second voltage source;
temperature measuring means for measuring a temperature and providing a temperature indicating signal indicating said measured temperature;
processing means for providing a second control signal responsive to said temperature indicating signal;
pulse generating means for generating pulses responsive to said second control signal;
first switching means for switching on and off responsive to said pulses to provide an output signal corresponding to said first control signal via a first conducting terminal, said first switching means having a second conducting terminal operatively coupled to said pulse generating means for receiving said pulses and a third conducting terminal operatively coupled to ground;
a first resistor having a first terminal operatively coupled to said first conduction terminal of said first switching means and a second terminal operatively coupled to the third input of said fan; and
a second resistor having a first terminal operatively coupled to ground and a second terminal operatively coupled to said second terminal of said first resistor, wherein
said first control signal is a current signal, and a circuit formed by the second voltage source and the second resistor provides a predefined current signal to the third input terminal to control said rotating speed to a predefined speed corresponding to a minimal speed.

2. The temperature control apparatus of claim 1, further comprising a capacitor having a first terminal operatively coupled to ground and a second terminal operatively coupled to said second terminal of said second resistor.

3. The temperature control apparatus of claim 1, further comprising second switching means having a first conducting terminal operatively coupled to said second input of said fan and a second conducting terminal operatively coupled to said processing means for receiving a third control signal to turn said fan on and off.

4. A method for controlling temperature, comprising steps of:
providing a fan having a field winding, a speed controller for providing a speed control signal to said field winding responsive to a first control signal to control a rotating speed of said fan, first and second inputs for enabling operating power to be provided to said field winding and said speed controller, and a third input for providing said first control signal to said speed controller, at least one of said first and second inputs being operatively coupled to a first voltage source, and said third input being operatively coupled to a second voltage source;
measuring a temperature and providing a temperature indicating signal indicating said measured temperature;

providing a second control signal responsive to said temperature indicating signal;

providing said first control signal to said third input of said fan responsive to said second control signal; and providing a third control signal to turn said fan on and off.

5. The method of claim 4, further comprising the steps of:

generating pulses responsive to said second control signal; and providing said first control signal to said third input of said fan responsive to said pulses.

6. The method of claim 4, wherein said fan is turned on if said measured temperature exceeds a threshold for a predetermined number of consecutive readings.

7. The method of claim 4, wherein said fan is turned off if said rotating speed of said fan is at a minimum speed, and said measured temperature is less than a threshold by a predetermined limit.

8. The method of claim 4, wherein said rotating speed of said fan is increased if said measured temperature exceeds a threshold for a predetermined number of consecutive readings.

9. The method of claim 4, wherein said rotating speed of said fan is decreased if said measured temperature decreases for a predetermined number of consecutive readings.

10. A device including a temperature control apparatus, said temperature control apparatus comprising:

a fan, including:
  a field winding;
  a speed controller for providing a speed control signal to said field winding responsive to a first control signal to control a rotating speed of said fan;
  first and second inputs for enabling operating power to be provided to said field winding and said speed controller, at least one of said first and second inputs being operatively coupled to a first voltage source; and
  a third input for providing said first control signal to said speed controller, said third input being operatively coupled to a second voltage source;

a temperature measuring circuit operative to measure a temperature and provide a temperature indicating signal indicating said measured temperature;

a processor operative to provide a second control signal responsive to said temperature indicating signal;

a pulse generator operative to generate pulses responsive to said second control signal;

a first switch operative to switch on and off responsive to said pulses to provide an output signal corresponding to said first control signal via a first conducting terminal, said first switch having a second conducting terminal operatively coupled to said pulse generator for receiving said pulses and a third conducting terminal operatively coupled to ground;

a first resistor having a first terminal operatively counted to said first conduction terminal of said first switch and a second terminal operatively coupled to said third input of said fan; and a second resistor having a first terminal operatively coupled to ground and a second terminal operatively coupled to said second terminal of said first resistor, wherein said first control signal is a current signal, and a circuit formed by the second voltage source and the second resistor provides a predefined current signal to the third input terminal to control said rotating speed to a predefined speed corresponding to a minimal speed.

11. The device of claim 10, further comprising a capacitor having a first terminal operatively coupled to ground and a second terminal operatively coupled to said second terminal of said second resistor.

12. The device of claim 10, further comprising a second switch having a first conducting terminal operatively coupled to said second input of said fan and a second conducting terminal operatively coupled to said processor for receiving a third control signal to turn said fan on and off.

* * * * *